United States Patent
Denneler et al.

(10) Patent No.: US 8,106,566 B2
(45) Date of Patent: Jan. 31, 2012

(54) PIEZOELECTRIC COMPONENT WITH OUTER CONTACTING, HAVING GAS-PHASE DEPOSITION, METHOD FOR MANUFACTURING COMPONENT AND USE OF COMPONENT

(75) Inventors: Stefan Denneler, München (DE); Axel Ganster, Schwindegg (DE); Susanne Kornely, München (DE); Carsten Schuh, Baldham (DE); Andreas Wolff, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/734,976

(22) PCT Filed: Nov. 13, 2008

(86) PCT No.: PCT/EP2008/065474
§ 371 (c)(1),
(2), (4) Date: Jun. 7, 2010

(87) PCT Pub. No.: WO2009/071426
PCT Pub. Date: Jun. 11, 2009

(65) Prior Publication Data
US 2010/0244636 A1      Sep. 30, 2010

(30) Foreign Application Priority Data

Dec. 6, 2007 (DE) .................. 10 2007 058 873

(51) Int. Cl.
*H01L 41/08* (2006.01)
(52) U.S. Cl. .................. 310/328; 310/366
(58) Field of Classification Search ............ 310/328, 310/366
See application file for complete search history.

(56) References Cited

U.S. PATENT DOCUMENTS

| | | | | |
|---|---|---|---|---|
| 4,932,119 A * | 6/1990 | Ealey et al. | ........... | 29/593 |
| 5,438,232 A * | 8/1995 | Inoue et al. | ........... | 310/328 |
| 5,523,645 A * | 6/1996 | Inoi | ........... | 310/364 |
| 5,969,464 A * | 10/1999 | Nakano et al. | ........... | 310/328 |
| 7,439,655 B2 * | 10/2008 | Asano et al. | ........... | 310/328 |
| 7,581,295 B2 * | 9/2009 | Miyoshi | ........... | 29/25.35 |
| 7,786,652 B2 * | 8/2010 | Nakamura et al. | ........... | 310/328 |
| 7,839,054 B2 * | 11/2010 | Cooke et al. | ........... | 310/328 |

FOREIGN PATENT DOCUMENTS

| | | |
|---|---|---|
| DE | 101 53 770 A1 | 6/2002 |
| DE | 101 63 358 A1 | 8/2002 |
| WO | 2004/107464 A1 | 12/2004 |
| WO | 2005/093866 A1 | 6/2005 |
| WO | 2008/101919 A1 | 8/2008 |

\* cited by examiner

OTHER PUBLICATIONS

International Search Report for Application No. PCT/EP2008/065474; mailed Apr. 6, 2009.

*Primary Examiner* — Mark Budd
(74) *Attorney, Agent, or Firm* — Staas & Halsey LLP

(57) ABSTRACT

A piezoelectric component with at least one fully active piezoelement has electrode layers and interposed piezoelectric layers guided to a lateral edge of the piezoelement and contacted there. An insulating layer applied for electric contacting has an electric through-plating. An electrically conductive gas-phase deposition layer is applied directly to the electrode layer guided up to the lateral surface of the piezoelement by way of deposition from the gas phase in order to improve electric contacting. An external electrode is applied to the gas-phase deposition layer. In the case of several superposed stacked piezoelements (piezoactuator in multi-layer design), the external electrode functions as a collector electrode which connects the electrode layers to each other. The structure enables secure contacting of the electrode layers. A fully active piezoceramic multi-layer actuator with the described contacting may be used in automobile technology for activating fuel-injection valves.

20 Claims, 2 Drawing Sheets

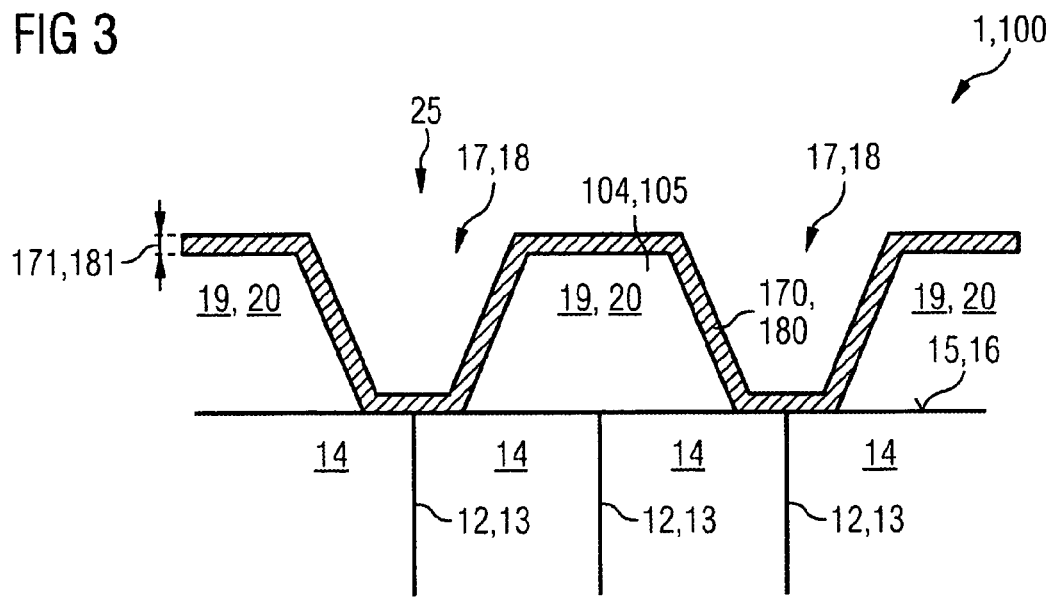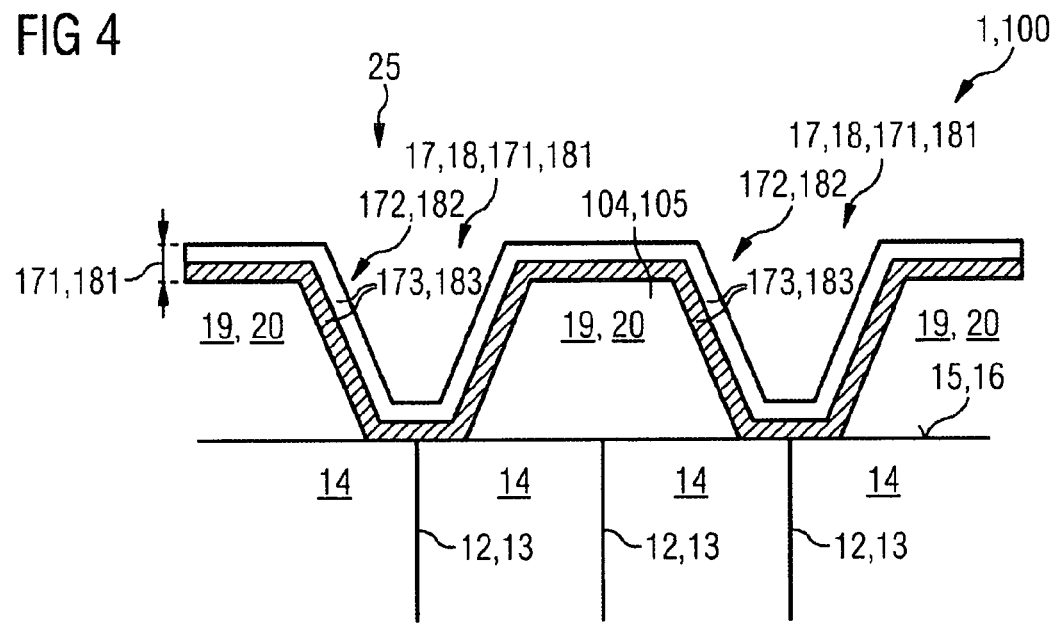

PIEZOELECTRIC COMPONENT WITH OUTER CONTACTING, HAVING GAS-PHASE DEPOSITION, METHOD FOR MANUFACTURING COMPONENT AND USE OF COMPONENT

CROSS REFERENCE TO RELATED APPLICATIONS

This application is the U.S. national stage of International Application No. PCT/EP2008/065474, filed Nov. 13, 2008 and claims the benefit thereof. The International Application claims the benefits of German Application No. 102007058873.0 filed on Dec. 6, 2007, both applications are incorporated by reference herein in their entirety.

BACKGROUND

Described below is a piezoelectric component with outer contacting, having gas phase deposition. In addition a method for manufacturing the component and use of the component are disclosed.

Piezoelectric components are typically used in the automotive industry for control of fuel injection valves. At the heart of these components is a piezoelement in which an electrode layer and the further electrode layer are arranged above one another. Located between the electrode layers is a piezoelectric layer. The piezoelectric layer typically is formed of a piezoceramic with lead-zirconate titanate (PZT). By activating the electrode layers with different electrical potentials an electric field is coupled into the piezoelectric layer. As a result of the coupled-in electric field there is a deflection (expansion or contraction respectively) of the piezoelectric layer and thereby of the piezoelement.

To achieve the greatest possible deflection while at the same time transmitting the highest possible force, the piezoelectric components are designed as multilayer components. In such cases a plurality of piezoelements are arranged above one another to form a piezoelement stack. Arranged alternately above one another in the piezoelement stack are electrode layers (inner electrodes) and piezoelectric layers.

Usually a so-called multilayer capacitor structure is realized for contacting the electrode layers. In such cases the electrode layers are routed alternately to different lateral surfaces of the piezoelement and thereby to different lateral surfaces of the piezoelement stack and electrically contacted there. In the case of monolithic piezoelement stacks in particular the problem here is that the electrode layers do not delimit the full surface of the piezoelectric layer arranged between them. The non-full-surface arrangement leads to piezoelectrically-active and piezoelectrically-inactive areas. Different electric fields are coupled into these areas. As a result of the different electric fields different deflections are produced and thereby mechanical stresses. These mechanical stresses generally lead to tears. The tears can be tolerated per se. However they lead to a significant outlay in respect of an outer electrode attached to the side surface of the piezoelement stack for electrical contacting of the electrode layers.

An alternate variant to this is represented by the so-called fully-active piezoactuator. In this piezoactuator the electrode layers and the further electrode layers delimit of the full surfaces of the piezoelectric layers arranged between them. This means that an essentially equal electrical field is coupled into the entire piezoelectric layer. The result is that mechanical stresses and resulting tears hardly occur. However the requirement for this is that the electrode layers are able to the individually electrically controlled. It must be ensured that the electrode layers can have the corresponding electrical potentials applied to them independently of each other.

It has already been proposed, for electrical contacting of the electrode layers up to the side surface of the piezoelement stack to first apply an insulation layer. Subsequently the insulation layer is selectively opened. Applied through the openings is an outer contacting with metallic particles having a particle diameter of 5 μm to 20 μm.

SUMMARY

An aspect is thus to demonstrate how the electrode layers of a piezoelement of a piezoelectric component can be contacted independently of one another and with a high current carrying capacity.

To achieve this, a piezoelectric component is specified with at least one stack-type piezoelement, which in the stack direction features at least one electrode layer with electric material at least one further electrode layer with further electrode material and at least one piezoelectric layer with piezoelectric material arranged between the electrode layers, with the electrode layer extending to at least one lateral surface section of the piezoelement, an electrical insulation layer being applied to the lateral surface section, at least one electrical through-contacting for electrical contacting of the electrode layer being present in the insulation layer and the electrical through-contacting having at least one electrically-conducting gas phase deposition layer applied directly to the electrode layer.

The further electrode layer also may be guided up to a side surface of the piezoelement. The further electrode layer extends to at least one further lateral surface section of the piezoelement, with a further electrical insulation layer being applied to the further natural surface section, for electrical contacting of the further electrode layer at least one further electrical through contacting being present in the further insulation layer and the further electrical through contact having at least one further electrically-conducting gas deposition layer applied directly to the electrode layer.

A method for producing the piezoelectric component includes the following:

a) Provision of at least one stack-type piezoelement with an electrode layer, at least one further electrode layer and at least one piezoelectric layer arranged between the electrode layers, with the electrode layer extending to a lateral surface section of the piezoelement.

b) Application of at least one electrical insulation layer to the surface section such that the electrode layer is freely accessible, c) Application of an electrical through-contacting with at least one gas phase deposition layer to the electrode layer by a gas phase deposition method and d) Application of an outer electrode, so that the outer electrode and the electrode layer are electrically contacted indirectly via the through-contacting and the outer electrode and the further electrode layer are electrically insulated from one another.

A piezoelement may be provided featuring at least one further electrode layer which extends to a further surface section of the piezoelement. The following further method steps are carried out:

b') Application of at least one further electrical insulation layer to the further surface section such that the further electrode layer is freely accessible, c') Application of a further electrical through-contacting with at least one further gas phase deposition layer to the further electrode layer by a further gas phase deposition method.

d') Application of a further outer electrode so that the further outer electrode and the further electrode layer are contacted indirectly via the further through-contacting and the further outer electrode and the electrode layer are insulated electrically from one another.

The gas phase deposition layer is metallic. Possible gas phase deposition methods for producing the gas phase deposition layer are PVD (physical vapor deposition) i.e. sputtering or vapor deposition or MOCVD (metal organic chemical vapor deposition).

The contact surface between an outer contacting and the electrode layer is relatively small since an electrode layer generally only has a layer thickness of 2 µm to 4 µm. By contrast the metallic particles of the outer contacting with 5 µm to 20 µm are relatively large so that the result is generally only contact between the outer contacting and the electrode layer at some points. With the aid of the metallic gas phase deposition layer it is ensured that the exposed electrode layers are contacted over their full surface. Thus the contact surface between the very small metal particles of the outer contacting and the electrode layers of the piezoelement is enlarged.

The insulation layer can be formed of any given insulation material, for example glass, ceramic and plastic. The insulation layer can be applied already pre-structured. For example the insulation layer is a structured foil. Likewise an insulating foil can be laminated-on unstructured and subsequently structured. Openings are created in the insulating foil. The opening is made for example by laser ablation. It is also conceivable for a photo-sensitive insulating foil to be used. The photo-sensitive insulating foil will be photo-structured such that the electrode layers are exposed at the respective surface sections. The insulation layer can however also be applied structured. This is typically done with the aid of the inkjet method.

On the surface section an outer electrode with contacting material may be connected indirectly via the gas phase deposition layer to the electrode layer and/or at the further surface section a further outer electrode with further contacting material is connected electrically-conductively indirectly via the further through-contacting with the further electrode layer. Power is supplied to the electrode layers via the outer contactings.

The piezoelectric component can feature a single piezoelement described above. The piezoelectric component may have a plurality of piezoelements stacked above one another. The piezoelectric component has a multilayer construction with electrode layers and piezoelectric layers arranged above one another. In accordance with a particular embodiment a piezoelectric component is thus specified with a plurality of piezoelements being arranged above one another into a piezoelectric stack such that the surface sections of the piezoelements form a common stack surface section, the insulation layers of the piezoelements form a common stack insulation layer, the outer electrodes of the piezoelements form a common stack outer electrode (collective outer electrode) which is supplied to the common stack insulation layer such that the common stack outer electrode and the electrode layers of the piezoelements are contacted indirectly via the through-contactings of the piezoelements and the common stack outer electrode and the further electrode layers of the piezoelements are electrically insulated from one another.

The plurality of piezoelements may be arranged into a piezoelement stack such that the further surface sections of the piezoelements form a common further stack surface section, the further insulation layers of the piezoelements form a common further stack insulation layer, the further outer electrodes of the piezoelements form a common further stack outer electrode (collective outer electrode) which is applied to the common further stack insulation layer such that the common further stack outer electrode and the further electrode layers of the piezoelements are electrically contacted indirectly via the further through contactings of the piezoelements and the common further stack outer electrode and the electrode layers of the piezoelements are insulated electrically from one another.

The gas phase deposition layer and/or the further gas phase deposition layer have a layer thickness selected from the range between 10 nm and 5 µm and especially selected from the range between 50 nm and 2 µm. Higher or lower layer thicknesses can also be provided.

The gas phase deposition layers can each have a single layer of a metal deposition. In a particular embodiment the gas phase deposition layer and/or the further gas phase deposition layer have a multilayer structure with a number of part gas phase deposition layers. For example the lowest part contacting layer, which is applied directly to a surface section, is formed of a layer made of titanium, of chrome or of a chrome-nickel alloy which adheres well. Over this is deposited a layer for improving the electrical conductivity. To improve the conductivity the through-contacting can also be electrically reinforced. In a particular embodiment the through-contacting thus features an electrical reinforcement applied to the gas phase deposition layer. The electrical reinforcement is for example an electrolytically-deposited copper layer. A layer thickness of this layer amounts to several µm, for example 10 µm or more, The metals can also be present in the further, electrically-conductive components of the piezoelectric component. In accordance with a particular embodiment the electrode material, the further electrode material, the gas phase deposition, the further gas phase deposition, the contacting material and/or the further contacting material feature at least one metal selected from the group chrome, gold, copper, nickel, palladium, platinum, titanium and silver. The metals can be present individually or together with other metals as alloys.

With the proposed individual contacting of the electrode layers and of the further electrode layers, a multilayer capacitor structure can be realized: The electrode layers and the further electrode layers do not delimit the full surface of the piezoelectric layer. However, the electrode layer and the further electrode layer may delimit the full surface of the piezoelectric layer. The piezoelectric component is fully active.

Because of the expansion and contraction, in accordance with a particular embodiment the insulation layer, the further insulation layer, the outer electrode and/or the further outer electrode and embodied to expand. This means that these can follow the expansion and contraction of the piezoelement and thereby of the piezoelement stack.

An expandable embodiment relates to the materials used for example. An elastomer, for example a silicon elastomer, is suitable as an insulation material. The same applies to the outer electrodes. In a particular embodiment the outer electrode and/or the further outer electrode thus feature an electrically-conductive adhesive. The electrically-conductive adhesive may feature a silicon elastomer. However it is also conceivable for the outer electrode to feature a flexible metal mesh.

In accordance with a particular embodiment the insulation layer, the further insulation layer, the outer electrode and/or the further outer electrode feature at least one longitudinal structuring and/or a transverse structuring in relation to the stack direction. These components are structured along or across the direction of the stack of the piezoelement or to the stack direction of the piezoelement stack. The structurings are embodied such that the mechanical tensile stresses occurring as a result of the expansion and contraction in the piezoelement or in the piezoelement stack are converted into shearing stresses in the above components. A transverse structuring also leads to an efficient mechanical decoupling from the expansion and contraction of the piezoelement or of the piezoelement stack. A tensile load on the components is reduced.

The form of the through-contacting can also be used to reduce tensile stresses. In accordance with a particular embodiment the through-contacting and/or the further through-contacting have a trapezoidal cross section. The expansions produced by the electrical activation of the electrode layers are not transformed into purely tensile stresses but predominantly into bending stresses within the gas phase deposition layer. Bending stresses, especially under permanent oscillation stresses, as can occur in piezoelectric components, are easier to bear for the mostly metallic materials of the gas phase deposition layer than pure tensile stresses. This increases the reliability of the gas deposition layer and thereby of the entire contacting of the electrode layers.

The gas phase deposition layers can be restricted to the electrode layer to be contacted in each case. To this end the gas phase deposition is only created in the opening of the insulation layer or of the further insulation layer. This is done by the areas to which no gas phase deposition layer is to be applied being covered. A covering during application of the further components, e.g. of the insulation layer, can also be sensible. In accordance with a further particular embodiment a mask is therefore used for applying the insulation layer, the further insulation layer, the through-contacting, the further through-contacting, the outer electrode and/or the further outer electrode. In conjunction with the gas phase deposition layers, the mask can be embodied such that the gas phase depositions only occur in the openings of the insulation layer. However it is also especially conceivable for the gas phase depositions to also be created on the insulation layer. The result is a piezoelectric component in which the gas phase deposition layer extends onto the insulation layer and/or the further through-contacting onto the further insulation layer.

In summary the following particular advantages are produced:
With the aid of the structured insulation layer and the structured outer electrode it is possible to provide a fully active piezoelectric component in which the electrode layers of the piezoelements are individually contacted.
By using the insulation layers, the gas phase deposition layer and the outer electrode, the electrode layers can be contacted individually and reliably, while simultaneously ensuring an efficient electrical installation from the adjacent electrode layers.
The result of the structuring of the insulation layers used is a flexible outer contacting which can follow the expansion and contraction of the piezoelectric component. The result is a component with high reliability.

BRIEF DESCRIPTION OF THE DRAWINGS

These and other aspects and advantages will become more apparent and more readily appreciated from the following description of exemplary embodiments and the associated figures which are schematic diagrams and do not represent a true-to-scale presentation and of which:

FIG. 3 is a section of the piezoelement stack from the side.
FIG. 4 is a section of a further piezoelement stack from the side.

DETAILED DESCRIPTION OF THE PREFERRED EMBODIMENT

Figure 1:
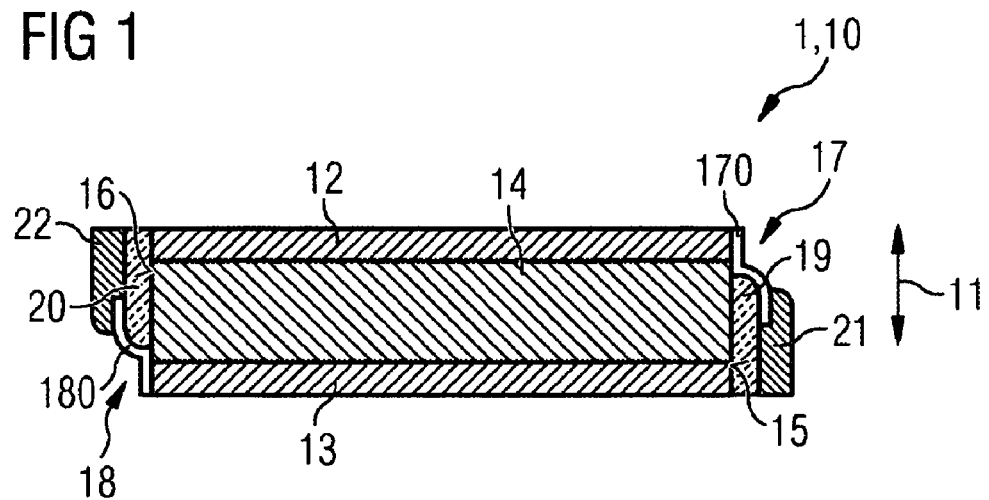
FIG. 1 is a lateral cross-section of a stack-type piezoelement.
Figure 2:
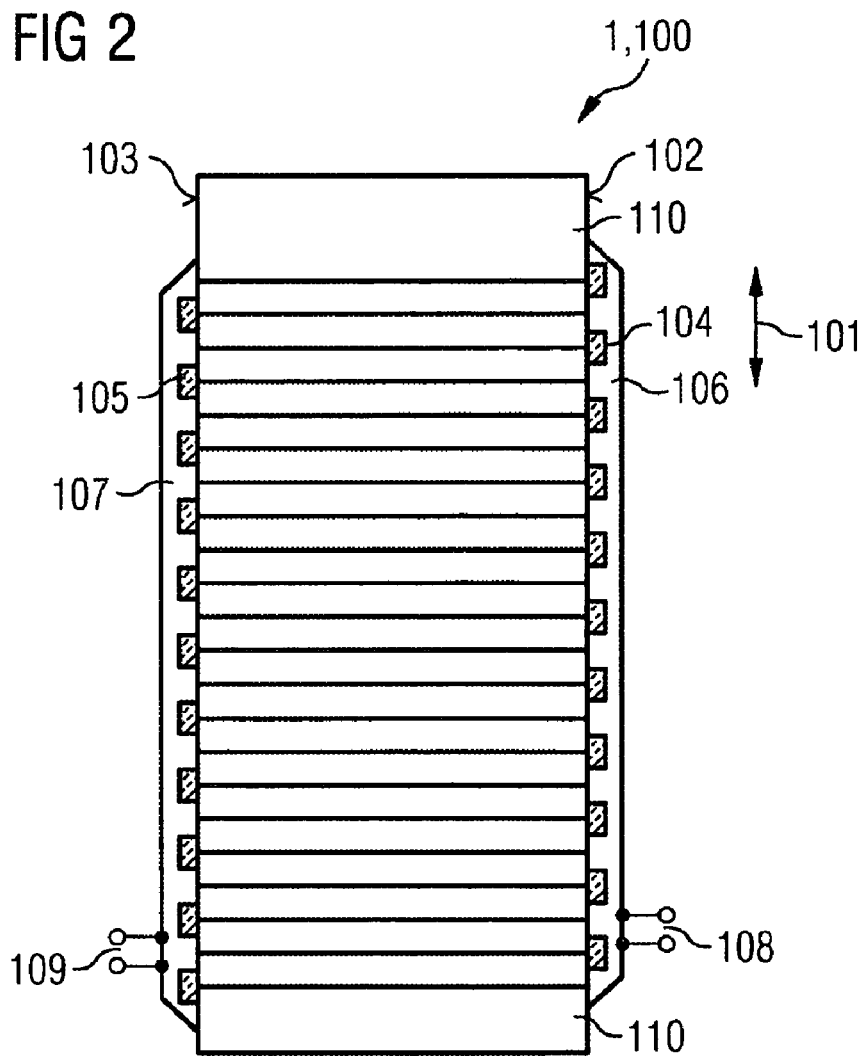
FIG. 2 is side view of a piezoelement stack.

Reference will now be made in detail to the preferred embodiments, examples of which are illustrated in the accompanying drawings, wherein like reference numerals refer to like elements throughout.

At the heart of the piezoelectric component 1 is a stack-type piezoelement 10 which has an electrode layer 12, a further electrode layer 13 and a piezoelectric layer 14 arranged in the stacking direction 11 between the two electrodes. The electrode material of the electrode layer and the further electrode material of the further electrode layer is a silver-palladium alloy in each case. The piezoelectric material of the piezoelectric layer is lead zirconate titanate, i.e. a piezoceramic. The piezoelement is monolithic.

In accordance with the exemplary embodiments a piezoelectric component of monolithic multilayer construction is present in each case. A plurality of piezoelements are arranged in the stack direction 101 above one other to form a piezoelement stack 100. The piezoelement stack is terminated in each case by a cover plate 110. These cover plates also are formed of lead zirconate titanate. However the cover plates are piezoelectrically inactive since no electrical field is coupled in here. The piezoelement stacks are monolithic. The monolithic piezoelement stack is obtained by ceramic green foils being printed with electrode material and with further electrode material and stacked above one another. The result is a multilayer piezoceramic green body which is subjected to debindering and subsequent sintering. The sintering produces a monolithic piezoelement stack.

The printing of the ceramic green foils is done by the electrode layer and/or the further electrode layer fully delimiting the surface of the adjacent piezoelectric layer in the piezoelement of the piezoelement stack.

The electrode layer extends to a lateral surface section 15 of the piezoelement. The further electrode layer extends to a further lateral surface section 16 of the piezoelement. Applied to the surface section 15 is an insulation layer 19 and to the further surface section a further insulation layer 20. In accordance with the first exemplary embodiment the insulation material and the further insulation material are a silicon elastomer in each case. In accordance with the second embodiment of the insulation material is a glass in each case. In a third embodiment of the insulation material is lead zirconate titanate.

The insulation layer has an opening on the surface section above the electrode layer. Inserted into the opening is the electrical through-contacting 17, with the gas phase deposition layer 170 being applied directly to the electrode layer extending up to the surface section. An outer electrode 21 is applied to the insulation layer and the gas phase deposition layer such that the outer electrode and the electrode layer are connected indirectly electrically-conductively to one another via the through-contacting. By contrast the outer electrode and the further electrode layer are electrically insulated from one another. The outer electrode in accordance with a first embodiment is formed of an electrically-conductive silicon elastomer. In an alternative embodiment the outer electrode is a metal mesh soldered to the gas phase deposition layer. The through-contacting has a trapezoidal cross-section 25.

The further electrode layer is routed to a further lateral surface section 16 of the piezoelement. For electrical contacting or insulation a further insulation layer 20, a further through-contacting 18, a further gas phase deposition layer 180 and a further outer electrode 22 are present on the further surface section.

In accordance with a first exemplary embodiment, the gas phase deposition layer or the further gas phase deposition layer are single layers (FIG. 3). The gas phase deposition layers are titanium layers created by sputtering with a layer thickness 171 or a further layer thickness 181 of 1 μm. As an alternative to this, the layers are formed of a chrome nickel alloy with the layer thicknesses also of 1 μm. As an alternative to this the gas phase deposition layer is multilayer (FIG. 4). It is formed of a number of part gas phase deposition layers.

In the piezoelement stack 100 of the piezoelements are arranged above on another such that the surface sections of the piezoelements form a common stack surface section 102. The insulation layers of the piezoelement lead to a common stack insulation layer 104. Likewise the outer electrodes of the piezoelements are combined into a common stack outer electrode 106. The same applies for the further electrode layers: The further surface sections of the piezoelements form a common further stack surface section 103, the further insulation layers of the piezoelements a further common stack insulation layer 105 and the further outer electrodes of the piezoelements a further stack outer electrode 107. An electrical terminal element 108 is applied to supply power to the stack outer electrode. A corresponding further electrical terminal element in 109 is applied to the further stack outer electrode. Power is supplied via these terminal elements to the electrode layers and the further electrode layers. Because of the arrangements of the electrode layers and of the further electrode layers and as a result of their electrical contacting or insulation, these electrode layers and the further electrode layers can have different electrical potentials applied to them.

In accordance with the exemplary embodiment the surface section and the further surface section are arranged on different sides of the piezoelement. The contacting of the electrode layers and the contacting of the further electrode layers is undertaken on different sides of the piezoelement and thereby of the piezoelement stack.

As an alternative to this, in an exemplary embodiment not shown, the surface section and the further surface section are arranged on a same side of the piezoelement. The electrical contacting of the electrode layer and of the further electrode layer occurs from the same side of the piezoelement and thereby from the same side of the piezoelement stack.

The procedure for producing the piezoelements is as follows: A sintered piezoelement stack with a corresponding number of piezoelements is provided. The electrode layers and the further electrode layers of the piezoelement adjoin the full surface of the respective piezoelectric layers.

The insulation layers are then applied. An insulation foil is laminated onto the stack surface sections of the piezoelement stack for this purpose. The insulation film is opened up at the surface sections at which the electrode layers and the further electrode layers are to be contacted by laser ablation. Subsequently the gas phase deposition layers are applied by sputtering.

Finally the outer electrodes are put onto the gas phase deposition layers.

The component may be used for controlling an injection valve of an internal combustion engine.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A piezoelectric component, comprising:
   at least one stack-type piezoelement having, in the stacking direction,
      at least one electrode layer with electrode material extending to at least a first lateral surface section of the piezoelement,
      at least one further electrode layer with further electrode material, and
      at least one piezoelectric layer with piezoelectric material arranged between electrode layers; and
   a first electrical insulation layer, applied to the first lateral surface section of the piezoelement; having at least one electrical through-contact with a trapezoidal cross-section, enabling electrical contacting of the electrode layer, the electrical through-contact having at least one electrically-conductive gas phase deposition layer applied directly to the at least one electrode layer and a first portion of the first lateral surface section of the piezoelement adjacent the at least one electrode layer.

2. The piezoelectric component as claimed in claim 1, wherein said piezoelectric component further comprises a second electrical insulation layer, applied to the second lateral surface section, having at least one further electrical through-contact with a trapezoidal cross-section, enabling electrical contacting of the further electrode layer, the further electrical through-contact having at least one further electrically-conductive gas phase deposition layer applied directly to the further electrode layer and a second portion of the second lateral surface section of the piezoelement adjacent the further electrode layer.

3. The piezoelectric component as claimed in claim 2, wherein at least one of the gas phase deposition layer and the further gas phase deposition layer has a layer thickness selected between 10 nm and 5 μm.

4. The piezoelectric component as claimed in claim 3, wherein at least one of the gas phase deposition layer and the further gas phase deposition layer has a layer thickness selected between 50 nm and 2 μm.

5. The piezoelectric component as claimed in claim 3, wherein at least one of the gas phase deposition layer and the further gas phase deposition layer has a multilayer construction with multiple part gas phase deposition layers.

6. The piezoelectric component as claimed in claim 5, wherein the electrical through-contact has an electrical reinforcement applied to the gas phase deposition layer and/or the further electrical through-contact has a further electrical reinforcement applied to the further gas phase deposition layer.

7. The piezoelectric component as claimed in claim 6, further comprising at least one of
   an outer electrode on the surface section, having contacting material connected electrically-conductively indirectly by the electrical through-contact to the electrode layer; and
   a further outer electrode on the further surface section, having further contacting material connected electrically-conductively indirectly via the further electrical through-contact to the further electrode layer.

8. The piezoelectric component as claimed in claim 7, wherein the piezoelectric layer has an entire outer surface covered by at least one of the electrode layer and the further electrode layer.

9. The piezoelectric component as claimed in claim 8, wherein at least one of the first insulation layer, the second insulation layer, the outer electrode and the further outer electrode is embodied to allow expansion.

10. The piezoelectric component as claimed in claim 7, wherein at least one of the insulation layer, the further insulation layer, the outer electrode and the further outer electrode has at least one longitudinal structure and/or a transverse structure relative to the stack direction.

11. The piezoelectric component as claimed in claim 7, wherein at least one of the outer electrode and the further outer electrode includes an electrically-conductive adhesive.

12. The piezoelectric component as claimed in claim 11, wherein the conductive adhesive includes a silicon elastomer.

13. The piezoelectric component as claimed in claim 7, wherein at least one of the outer electrode and the further outer electrode includes a metal mesh.

14. The piezoelectric component as claimed in claim 7, wherein the at least one electrically-conductive gas phase deposition layer and the at least one further electrically-conductive gas phase deposition layer do not penetrate into the first and second lateral surface sections of the piezoelement, respectively.

15. The piezoelectric component as claimed in claim 7, wherein the gas phase deposition layer extends to the insulation layer and/or the further gas phase deposition layer extends to the further insulation layer.

16. The piezoelectric component as claimed in claim 7, wherein at least one of the electrode material, the further electrode material, the gas phase deposition, the further gas phase deposition, the contacting material and the further contacting material includes at least one metal selected from the group of chrome, gold, nickel, palladium, platinum, titanium and silver.

17. The piezoelectric component as claimed in claim 7, wherein at least one of the insulation material and the further insulation material includes at least one material selected from the group of plastic, glass and ceramic.

18. The piezoelectric component as claimed in claim 7, wherein a plurality of piezoelements are arranged above one another to form a piezoelement stack where
   surface sections of the piezoelements form a common stack surface section,
   the first and second insulation layers of the piezoelements form a common stack insulation layer, and
   the outer electrodes of the piezoelements form a common stack outer electrode, applied to the common stack insulation layer, such that the common stack outer electrode and the electrode layers of the piezoelements are electrically contacted indirectly via the electrical through-contacts of the piezoelements, and the common stack outer electrode and the further electrode layers of the piezoelements are electrically insulated from one another.

19. The piezoelectric component as claimed in claim 17, wherein a majority of the piezoelements are arranged above one another into a piezoelement stack, such that
   the further surface sections of the piezoelements form a common further stack surface section,
   the further insulation layers of the piezoelements form a common further stack insulation layer,
   the further outer electrodes of the piezoelements form a common further stack outer electrode applied to the common further stack insulation layer, so that the common further stack outer electrode and the further electrode layers of the piezoelement are electrically contacted indirectly via the further electrical through-contacts of the piezoelements and the common further stack outer electrode and the electrode layers of the piezoelements are electrically insulated from one another.

20. The piezoelectric component as claimed in claim 19, wherein said piezoelectric component controls an injection valve of an internal combustion engine.

* * * * *